United States Patent

Moran et al.

Patent Number: 5,984,697
Date of Patent: Nov. 16, 1999

[54] GROUND CLIP APPARATUS FOR CIRCUIT BOARDS

[75] Inventors: Sean A. Moran; Roger W. Berg, both of Carlsbad, Calif.

[73] Assignees: QUALCOMM Incorporated, San Diego, Calif.; Sony Electronics Inc., Park Ridge, N.J.

[21] Appl. No.: 08/984,443

[22] Filed: Dec. 3, 1997

[51] Int. Cl.⁶ .................................................. H01R 4/66
[52] U.S. Cl. ............................................. 439/92; 361/804
[58] Field of Search .................................. 439/65, 74, 94, 439/95, 108, 92; 361/804

[56] References Cited

U.S. PATENT DOCUMENTS

| | | | |
|---|---|---|---|
| 4,403,761 | 9/1983 | Jamar | 439/83 |
| 4,855,873 | 8/1989 | Bhargava | 439/92 |
| 4,938,703 | 7/1990 | Nakano | 439/74 |
| 5,022,873 | 6/1991 | Kollmann | 439/92 |
| 5,281,149 | 1/1994 | Petri | 439/74 |
| 5,345,366 | 9/1994 | Cheng et al. | 439/74 |
| 5,460,543 | 10/1995 | Kosmala | 439/567 |

FOREIGN PATENT DOCUMENTS

| | | | |
|---|---|---|---|
| 0359223 | 9/1989 | European Pat. Off. | H01R 23/72 |
| 0582145 | 7/1993 | European Pat. Off. | H01R 9/09 |
| 2-250276 | 10/1990 | Japan . | |

*Primary Examiner*—Michael L. Gellner
*Assistant Examiner*—Briggitte R. Hammond
*Attorney, Agent, or Firm*—Russell B. Miller; Roger W. Martin; Charles D. Brown

[57] ABSTRACT

A ground clip apparatus is designed to make ground contact between two circuit boards as they are mated together. A standoff member is mounted on one of the boards and a spring clip member is mounted on the other board facing the standoff member. The spring clip member has spring arms which are biased against the standoff member when the boards are mated together to make a reliable ground contact. At the same time, the standoff member resists deflection of either board towards the other board.

16 Claims, 2 Drawing Sheets

GROUND CLIP APPARATUS FOR CIRCUIT BOARDS

BACKGROUND OF THE INVENTION

The present invention relates generally to the making of a ground connection between two circuit boards or printed wiring boards, and is particularly concerned with electronic units such as cellular or other portable phones, calculators, and the like in which a main printed wiring board is secured beneath a keyboard.

The keyboard and printed wiring board are generally secured together by fastener devices such as screws and the like at the perimeter of the boards. However, due to the flexibility of the keyboard or panel material, some deflection of the keyboard can occur when keys are depressed, and the underlying printed wiring board may be provided with bumps or protrusions in order to prevent the keyboard from deflecting too far. Both boards must be grounded.

SUMMARY OF THE INVENTION

It is an object of the present invention to provide a new and improved stand off and ground apparatus for linking two printed wiring boards such as a main printed wiring board and an overlying keyboard.

According to the present invention, a ground clip apparatus for connecting a ground on one circuit board to another circuit board is provided, which comprises a standoff member of conductive material for mounting on a first circuit board, and a spring clip member of conductive material for mounting on a second circuit board facing the standoff member, the spring clip member having a base for connection to the second circuit board and a pair of spring arms projecting from the base for resilient engagement with the standoff member when the two circuit boards are connected together, whereby the standoff member and spring clip member together provide a ground link between the two boards, and the standoff member limits deflection of the second circuit board.

Preferably, the standoff member has a spacer surface and a pair of opposing surfaces depending from the spacer surface, and the spring clip arms are designed to bear against at least one of the surfaces when the two boards are connected together. In one embodiment, the spring clip is "mustache"-shaped, with the spring arms being curved inwardly towards one another so that each arm forms at least a major portion of a circle and has an inwardly facing curved portion for bearing against the standoff member surface. As the boards are connected together, the spring arms snap over the opposing surfaces of the standoff member. The height of the standoff member is selected according to the desired "standoff" between the two boards, or the separation between the boards when they are connected together with suitable fasteners.

In another embodiment, the spring arms are each of V-shape with the apex of the V facing inwardly. As the boards are connected together, the arms may either be compressed by the outer spacer surface of the standoff member, or else snap over the outer opposing surfaces of the standoff member. In either case, the arms are biased against the respective surface or surfaces of the standoff member to ensure that a ground link is made.

In another alternative, the spring arms are inclined outwardly away from one another, and biased outwardly by the standoff member as the boards are connected together, again ensuring that a ground link is made between the boards. Typically, one of the members will be soldered to a ground pad on one of the boards, so that a ground link or connection is provided to the other board.

According to another aspect of the invention, a circuit board assembly is provided which comprises a pair of circuit boards secured together with a predetermined spacing between the boards, each board having an inner surface facing the other board, one of the boards having a ground pad connected to ground, at least one spacer member connected to the inner surface of one of the boards, a ground clip member connected to the inner surface of the other board facing the spacer member, one of the members being connected to the ground pad, the ground clip member having a pair of opposing spring arms biased against the spacer member to make a ground connection between the two boards, and the spacer member resisting deflection of the boards towards one another.

With this arrangement, ground contact between the boards is ensured even when the keyboard moves. Since the keyboard will be of a material having some inherent resilience, it will depress inwardly in regions where a key is pressed and move outwardly in adjacent regions. Due to the biasing of the spring arms against the standoff member, the two members will still stay in contact even when such slight movements of the keyboard occur. More than one set of ground clip components may be provided on a keyboard. When the two boards are mated or secured together, the standoff member is forced between or against the spring arms of the clip, making a reliable ground contact between the boards.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
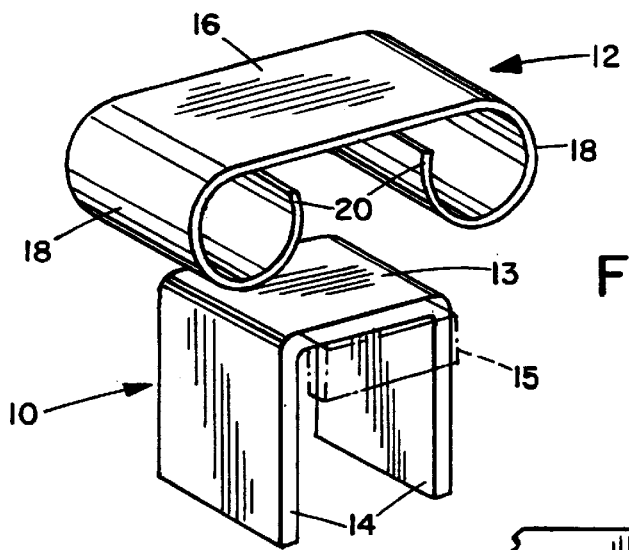
FIG. 1 is a perspective view of the spring clip and standoff components according to a first embodiment of the invention.
Figure 2:
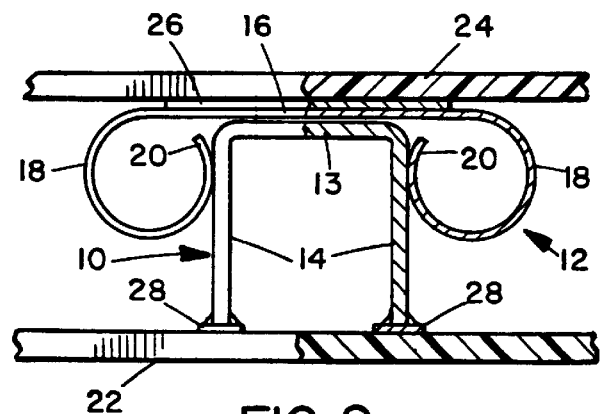
FIG. 2 is a side view, partially cut away, showing a circuit board carrying the spring clip seated on the standoff which is attached to a main circuit board.

FIGS. 1 and 2 of the drawings illustrate a ground clip apparatus according to a first embodiment of the invention. The apparatus comprises two components, a standoff member 10 and a spring clip member 12, each of conductive material such as brass or other similar material. The standoff member 10 has an upper panel 13 and a pair of downwardly depending legs 14 to define a table-like shape. It may also have end tabs 15 if required for viewing by an optical pick and place device.

The spring clip member 12 has a base 16 and a pair of spring arms 18 depending from opposite ends of the base. In the illustrated embodiment, the spring clip member is generally "mustache"-shaped, and is formed from a single sheet of material with the opposite ends bent down and curved inwardly to form the major portion of a circle at each end of the clip, such that bent or curved regions 20 face inwardly towards one another.

FIG. 2 illustrates mounting of the ground clip apparatus of FIG. 1 between two circuit boards 22,24 which are mated or coupled together in any conventional manner. The boards may, for example, comprise a main printed wiring board and a key board of a cellular phone or the like. One of the boards 24 has a ground pad 26 on its inner face which is suitably linked to ground. The base 16 of the spring clip 12 is suitably soldered in face to face engagement with ground pad 26, so that the spring arms depend away from the board and towards the second board 22. The two legs 14 of the standoff member 10 are suitably soldered to solder pads 28 provided on the inner face of the opposing board 22. It will be understood that the illustrated arrangement may be reversed, with the ground pad on the board 22 and the standoff member soldered to the ground pad, if desired.

When the two boards 22,24 are mated, the standoff member 10 is forced between the arms of the spring clip 12 as illustrated in FIG. 2, making an electrical ground between the boards. The spring arms 18 will be forced outwardly, so that they are biased inwardly against the opposing outer surfaces of the legs 14, ensuring that the ground is maintained even if the boards move slightly during use of the device in which the boards are mounted. The standoff member 10 is of predetermined height depending on the desired "standoff" between the boards. Printed wiring boards are generally of material which has some resilience, so that a keyboard, for example, may deflect towards an underlying main printed wiring board when the user depresses keys. A standoff member is arranged to limit such keyboard deflection. In the embodiment illustrated in FIG. 2, the two boards are held apart by a distance equal to the height of standoff member 10 plus the thickness of the base 16 of the spring clip member 12.

Figure 3:
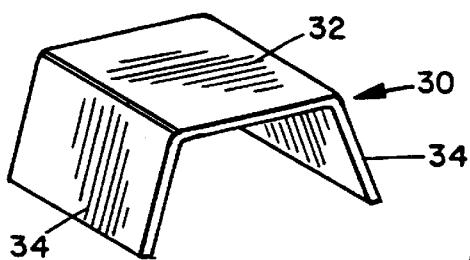
FIG. 3 is a perspective view of an alternative spring clip.
Figure 4:
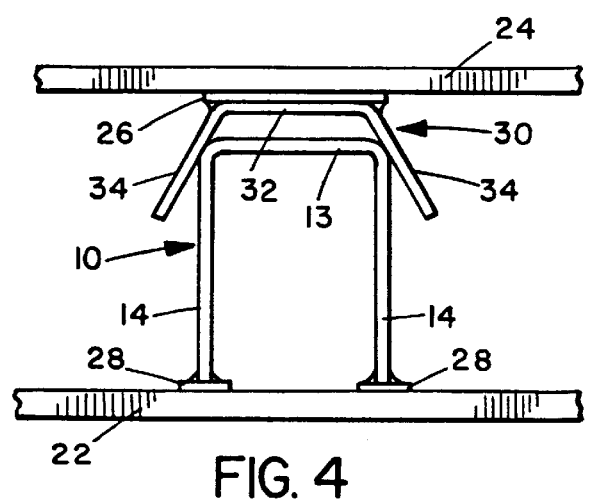
FIG. 4 is a side view showing the use of the clip of FIG. 3.

FIGS. 3 and 4 illustrate a second embodiment of the invention. In this embodiment, the same standoff member 10 is used, and like reference numerals have been used as appropriate. However, the spring clip member 30 is different in this embodiment. The spring clip member 30 has a base 32 and a pair of outwardly inclined spring arms 34. The two members are secured to the boards 22,24 in the same way as in the previous embodiment.

In this case, when the two boards are mated together, the upper end of the standoff member 10 will abut the spring arms 34 and force them upwardly and outwardly, making an electrical ground between the boards. The arms will be biased against opposite edges of the standoff member, so that the electrical ground will be maintained even if deflection of the board 24 causes some movement of the spring clip member 30. At the same time, a standoff will be maintained between the boards dependent on the height of the standoff member.

Figure 5:
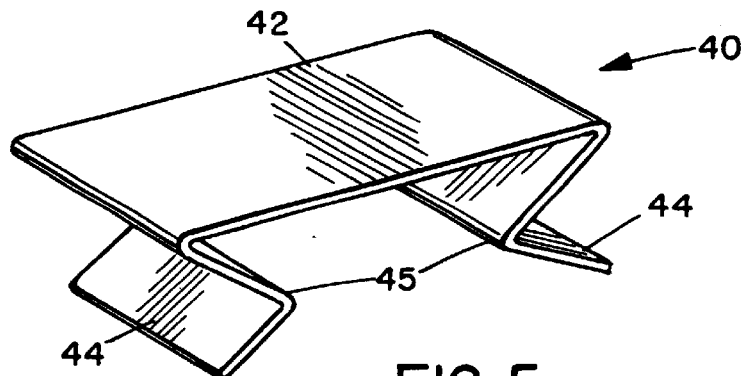
FIG. 5 is a perspective view of a further type of spring clip.
Figure 6:
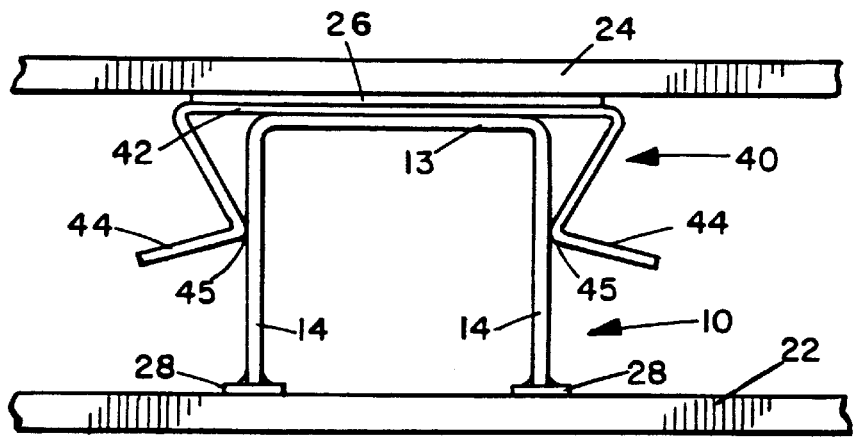
FIG. 6 is a side view showing one use of the clip of FIG. 5.
Figure 7:
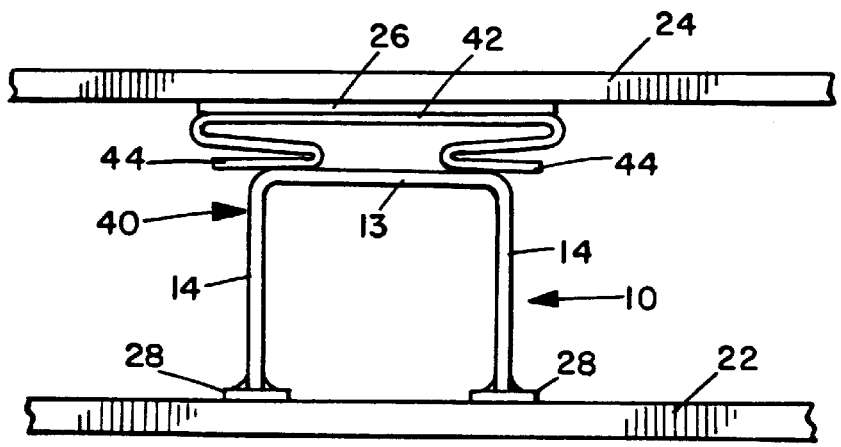
FIG. 7 is a similar side view showing an alternative use of the clip of FIG. 5.

FIGS. 5–7 illustrates a third embodiment of the invention in which a different spring clip 40 is used but the other parts are the same as in the previous embodiments, and like reference numerals are used for like parts as appropriate. In this embodiment, spring clip 40 has a base 42 and a pair of spring arms 44 which are each generally V-shaped, with the apex 45 of the V facing inwardly towards the other arm, providing a pinch or waist 46.

As in the previous embodiments, the base 42 of the spring clip is soldered to ground pad 26 on board 24, while the standoff member 10 is soldered to solder pads 28 on the other board 22. In this case, dependent on the dimensions of the clip 40 and standoff member 10, there are two alternative assembled configurations which are illustrated in FIGS. 6 and 7. In the first configuration of FIG. 6, the separation between the apices of the two spring arms 44 in the unstressed condition is only slightly less than the width of standoff member 10, so that the arms are biased outwardly around the legs 14 when the boards are mated together. In this case, the standoff member is gripped between the arms 44 and the biasing force of the arms against the opposing surfaces of legs 14 maintains ground contact between the boards.

In the second embodiment, the separation between the apices of arms 44 is less than the width of the standoff member such that the arms cannot spring out around member 10. Instead, the spring arms 44 are compressed upwardly by the upper panel in an accordion-like manner. In this configuration, the arms 44 are biased downwardly against the upper panel 13 when the boards are mated together, maintaining ground contact between the boards even in the event of slight deflections of the board 24.

In both configurations, a standoff will be maintained resisting downward deflection of board 24. In the configuration of FIG. 6, the boards are held apart by a distance equal to the height of standoff member 10 and the thickness of base 42 of the spring clip. In the configuration of FIG. 7, the boards will be held apart by a distance equal to the height of standoff member 10 and the height of the spring clip at its maximum compression.

In each of the above embodiments, a reliable electrical ground occurs when the spring clip and standoff members mate together. The ground is maintained even in the event of slight deflections of the boards due to the resilience of the spring arms which are biased against opposing surfaces of the standoff member. At the same time, the assembly will act to prevent the keyboard from deflecting too far and damaging underlying components as the user depresses keys, since the standoff member will hold the two boards apart by the desired amount.

Although some preferred embodiments of the invention have been described above by way of example only, it will be understood by those skilled in the field that modifications may be made to the disclosed embodiments without departing from the scope of the invention, which is defined by the appended claims.

We claim:

1. A ground clip apparatus for connecting a ground on one circuit board to another circuit board, comprising:
    a standoff member of conductive material for mounting on a first circuit board; and
    a spring clip member of conductive material for mounting on a second circuit board facing the standoff member;
    the spring clip member having a base for connection to the second circuit board and a pair of spring arms projecting from the base for resilient engagement with the standoff member when the two circuit boards are connected together, whereby the standoff member and spring clip member together provide a ground link between the two boards, and the standoff member limits deflection of the second circuit board.

2. The apparatus as claimed in claim 1, wherein each spring arm is V-shaped and has an apex facing inwardly towards the other spring arm.

3. The apparatus as claimed in claim 1, wherein the spring arms are inclined outwardly away from one another.

4. The apparatus as claimed in claim 1, wherein said standoff member has a spacer surface and a pair of opposing surfaces depending from the spacer surface, and the spring clip arms comprise means for bearing against at least one of the surfaces when the members are mated together.

5. The apparatus as claimed in claim 4, wherein said spring arms are curved inwardly towards one another.

6. The apparatus as claimed in claim 5, wherein each spring arm is curved to form at least a major portion of a circle, and has an inwardly facing curved portion facing the other spring arm, the inwardly facing curved portions comprising means for engagement with the opposing surfaces of said standoff member.

7. The apparatus as claimed in claim 6, wherein said spring clip is mustache-shaped.

8. A circuit board assembly, comprising:
- a pair of circuit boards secured together with a predetermined spacing between the boards, each board having an inner surface facing the other board, one of the boards having a ground pad connected to ground;
- at least one standoff member connected to the inner surface of one of the boards;
- a spring clip member connected to the inner surface of the other board facing the standoff member;
- one of the members being connected to the ground pad; and
- the spring clip member having a pair of opposing spring arms biased against the standoff member to make a ground connection between the two boards, and the standoff member resisting deflection of the boards towards one another.

9. The assembly as claimed in claim 8, wherein the standoff member has an outer, spacer surface and a pair of legs depending from the spacer surface and attached to the respective board, and the spring arms are engaged over the legs of the standoff member.

10. The assembly as claimed in claim 8, wherein the spring arms are compressed between the spacer surface of the standoff member and the respective board on which the spring clip member is mounted.

11. The apparatus as claimed in claim 8, wherein the spring arms are inclined outwardly away from one another and engage over the standoff member.

12. The apparatus as claimed in claim 8, wherein each spring arm is curved to form at least a major portion of a circle, and has an inwardly facing curved portion facing the other spring arm, the inwardly facing curved portions engaging over the standoff member.

13. The apparatus as claimed in claim 12, wherein said spring clip is mustache-shaped.

14. The apparatus as claimed in claim 8, wherein each spring arm is V-shaped and has an apex facing inwardly towards the other spring arm.

15. The apparatus as claimed in claim 14, wherein the spring arms are compressed in an accordion-like manner between the spacer surface of the standoff member and the board on which the spring clip member is mounted.

16. The apparatus as claimed in claim 14, wherein the spring arms engage over the standoff member.

* * * * *